US007375997B2

(12) United States Patent
Rice et al.

(10) Patent No.: US 7,375,997 B2
(45) Date of Patent: May 20, 2008

(54) DEVICE IDENTIFICATION USING A PROGRAMMABLE MEMORY CIRCUIT

(75) Inventors: Hugh Rice, Vancouver, WA (US); Volker Smektala, Camas, WA (US); Erik Ness, Vancouver, WA (US); Sam Sarmast, Vancouver, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/492,517

(22) Filed: Jul. 24, 2006

(65) Prior Publication Data

US 2006/0262161 A1 Nov. 23, 2006

Related U.S. Application Data

(62) Division of application No. 10/778,415, filed on Feb. 13, 2004, now Pat. No. 7,108,357.

(51) Int. Cl.
*G11C 17/00* (2006.01)

(52) U.S. Cl. ..................................... 365/96; 365/225.7

(58) Field of Classification Search ................ 324/691; 365/96, 225.7; 347/19, 14

See application file for complete search history.

(56) References Cited

U.S. PATENT DOCUMENTS 4,630,241 A * 12/1986 Kobayashi et al. ......... 365/200
5,363,134 A 11/1994 Barbehenn et al.
5,471,163 A 11/1995 Childers
5,635,968 A 6/1997 Bhaskar et al.
5,691,750 A 11/1997 Edwards
5,835,817 A 11/1998 Bullock et al.
5,966,144 A 10/1999 Edwards
6,019,450 A 2/2000 Mochizuki et al.
6,039,430 A 3/2000 Helterline et al.
6,161,915 A 12/2000 Bolash et al.
6,179,401 B1 1/2001 Stephens, Jr. et al.
6,325,483 B1 * 12/2001 Harbour et al. ............... 347/19
6,360,174 B1 3/2002 Shoki
6,371,586 B1 4/2002 Saruta
6,406,120 B2 6/2002 Pauschinger
6,512,284 B2 1/2003 Schulte et al.
6,568,783 B2 * 5/2003 Hu et al. ....................... 347/19
6,568,785 B1 5/2003 Edelen et al.
6,798,684 B2 * 9/2004 Low et al. ..................... 365/96
6,807,123 B2 * 10/2004 Kaiser et al. ............ 365/225.7

* cited by examiner

*Primary Examiner*—Pho M. Luu

(57) ABSTRACT

Systems and methods for identifying a device using a programmable memory circuit having at least one partially blown fuse are described herein. An electronic controller is configured to determine a resistance associated with a partially blown fuse in a programmable memory circuit and to determine an identifier based on the resistance.

16 Claims, 6 Drawing Sheets

DEVICE IDENTIFICATION USING A PROGRAMMABLE MEMORY CIRCUIT

This application is a Divisional of U.S. patent application Ser. No. 10/778,415, filed on Feb. 13, 2004, now U.S. Pat. No. 7,108,357, which is incorporated herein by reference.

TECHNICAL FIELD

The systems and methods described herein relate to identification for fluid ejection apparatuses, and amongst other things, to utilizing programmable memory circuits for identification with respect to fluid ejection apparatuses.

BACKGROUND

Conventional fluid ejection systems, such as inkjet printing systems, include a printhead, an ink supply that provides liquid ink to the printhead, and an electronic controller that controls the printhead. The printhead ejects ink drops through multiple nozzles (also referred to as orifices) toward a print medium, such as a sheet of paper, thereby printing onto the print medium. Typically, the multiple nozzles are arranged in one or more arrays such that properly sequenced ejection of ink from the nozzles causes characters or other images to be printed on the print medium as the printhead and the print medium are moved relative to one another.

To enhance usability and simplify maintenance, certain fluid ejection devices incorporate one or more printhead assemblies, each including both a printhead and an ink supply. When the ink supply is depleted or if a different printhead is desired, the entire printhead assembly is replaced. A printhead assembly may be identified by an integrated programmable read-only memory (PROM). The PROM is programmed, during manufacturing or operations of the printhead, by blowing (also referred to as “burning”) one or more fuses contained in the PROM. Thus, each fuse in the PROM can carry one bit of information. Many different types of data can be programmed in a PROM. For example, a PROM can be programmed with a serial number, a model number, electrical calibration data, fluidic data, or other data.

One typical application of a PROM is to provide an identification number to a printhead assembly. To be unique, the identification number should be represented by as many bits as possible. Although a PROM is an effective means of providing such an identification number, the size of the identification number that can be programmed into the PROM is limited to the number of fuses multiplied by one bit per fuse (i.e., either the fuse is intact or completely blown).

Thus, there is a need to increase the amount of information provided by a PROM circuit without increasing either the cost or complexity of the PROM circuit.

BRIEF DESCRIPTION OF THE DRAWINGS

The systems and methods discussed herein are illustrated by way of example and not limitation in the figures of the accompanying drawings. Similar reference numbers are used throughout the figures to reference like components and/or features.

DETAILED DESCRIPTION

The systems and methods described herein enable a programmable memory circuit to store an identifier for identification purposes. The systems and methods allow one or more of the fuses of the programmable memory circuit to be partially blown. When a fuse is partially blown, its resistance is less than a maximum resistance of the fuse. Each of the partially blown fuses possesses a resistance value that is used to represent multiple bits of data. The data represented by the fuses in the programmable memory circuit are combined to form a unique identifier. Although particular examples described herein refer to inkjet printing devices and systems, the systems and methods discussed herein are applicable to provide an identifier for uniquely identifying any devices or objects.

Figure 1:
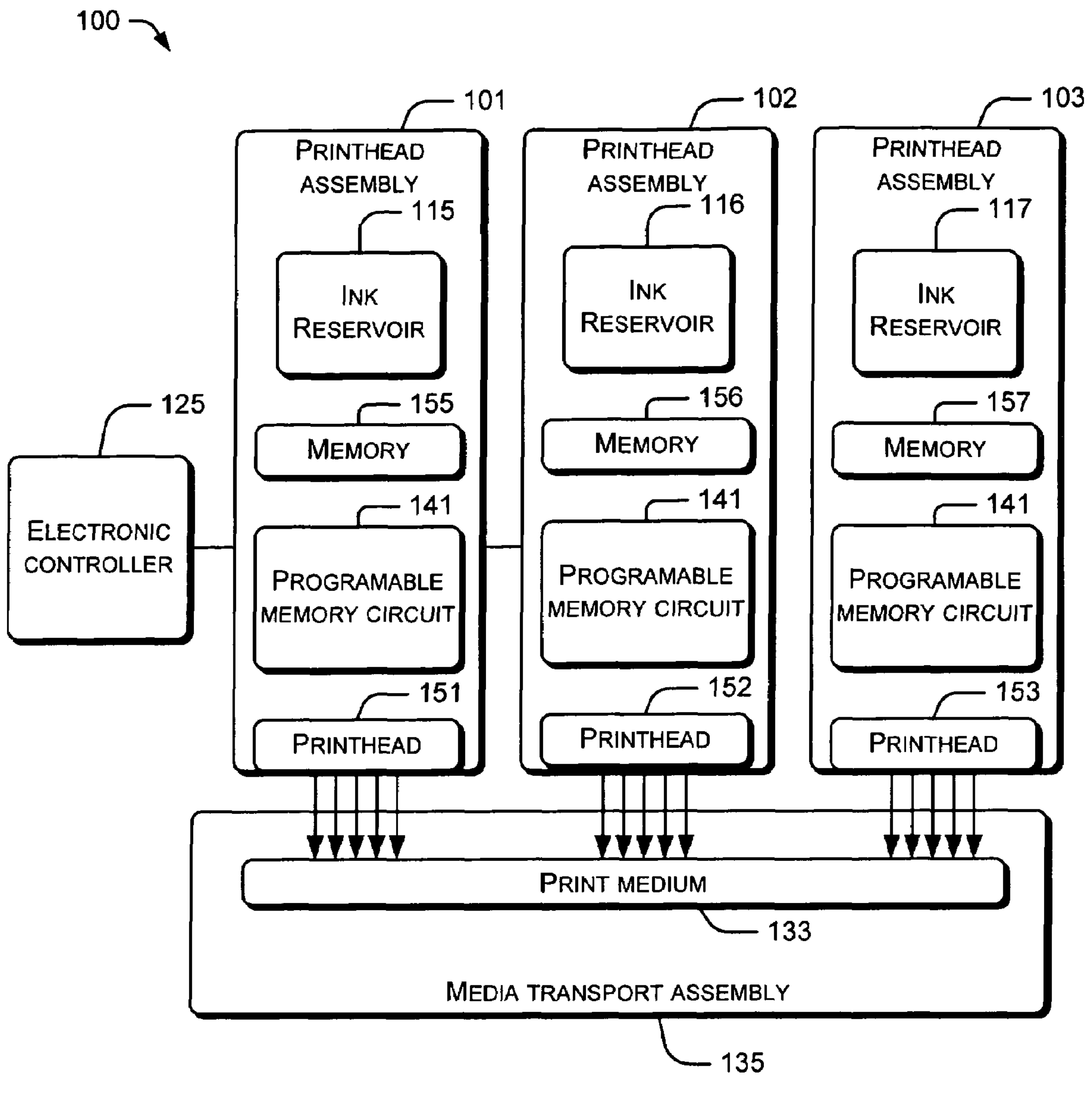
FIG. 1 is a graphical representation of one embodiment of an inkjet printing system.

FIG. 1 is a graphical representation of an example inkjet printing system 100. For illustrative purposes, inkjet printing system 100 is shown to include printhead assemblies 101-103, electronic controller 125 and media transport assembly 135. In practice, inkjet printing system 100 may include more or less components than those shown in FIG. 1.

Media transport assembly 135 is configured to handle print media, such as print medium 133. In particular, media transport assembly 135 is configured to position print medium 133 relative to printhead assemblies 101-103 during printing. The operations of media transport assembly 135 are controlled by electronic controller 125. Print medium 133 may include any type of material such as paper, card stock, transparencies, Mylar and the like.

Printhead assemblies 101-103 are configured to deliver drops of ink on print medium 133. Printhead assemblies 101-103 may be configured to move relative to print medium 133. Electronic controller 125 may coordinate the movements of printhead assemblies 101-103 and print medium 133 to obtain the desired relative positions during printing. Each of the printhead assemblies 101-103 may include multiple nozzles. Drops of ink are ejected toward print medium 133 through these nozzles as printhead assemblies 101-103 and print medium 135 are moved relative to one another. Typically, the nozzles are arranged in one or more columns (or arrays) such that the properly sequenced ejection of drops of ink from the nozzles causes characters, symbols, and/or other graphics or images to be printed on print medium 133.

Printhead assemblies 101-103 may include printheads 151-153 that eject drops of ink. In operation, energy is applied to resistors or other energy-dissipating elements in the printhead, which transfers the energy to ink in one or more nozzles or orifices in the printhead. This application of energy to the ink causes a portion of the ink to be ejected out of the nozzle toward the print medium 133. As ink is ejected from the nozzle, additional ink is received into the nozzle from the ink reservoir inside or outside the printhead assemblies 101-103. In FIG. 1, ink reservoirs 115-117 are incorporated into printhead assemblies 101-103, respectively. However, ink reservoirs 115-117 may also be arranged as separate components that are coupled to printhead assemblies 101-103.

Printhead assemblies 101-103 may include programmable memory circuits 141, which in one embodiment are fabricated on a substrate that includes printheads 151-153. Each of the programmable memory circuits 141 typically includes multiple resistors or fuses. A fuse that is intact has a specified resistance and is thus predictable. The fuse is configured to blow when it is energized with electric current that exceeds a threshold amount. Blowing a fuse may also referred to as "burning" a fuse. A fuse is blown when the structure of the fuse is damaged, which adversely affects the fuse's electrical conduction properties. In particular, when a fuse is blown, the resistance of the fuse becomes much higher compared to the resistance of the fuse when it was intact. The resistance of a blown fuse depends on the extent and the arrangement of the structural damage. Thus, the resistance of a blown fuse can provide a value that is unique and not easily duplicated. In one embodiment, the resistance of each fuse in programmable memory circuits 141 is used to represent multiple bits of data. Data associated with the multiple fuses of each of the programmable memory circuits 141 are used together to encode an identifier. The identifier may be used to uniquely identify printhead assemblies 101-103, ink reservoirs 115-117, or any component of inkjet printing system 100.

Electronic controller 125 is configured to control the operations of inkjet printing system 100. For example, electronic controller 125 may control how media transport assembly 135 positions print medium 133. Electronic controller 125 may also control the movements and printing operations of printhead assemblies 101-103. In a particular embodiment, electronic controller 125 provides timing control for ejection of ink drops by printhead assemblies 101-103. Electronic controller 125 defines a pattern of ejected ink drops that form characters, symbols, and/or other graphics or images on print medium 133. Timing control and the pattern of ejected ink drops may be determined by, for example, the print job commands and/or command parameters. In one embodiment, logic and drive circuitry forming a portion of electronic controller 125 is incorporated in an integrated circuit (IC) located on printhead assemblies 101-103. In another embodiment, logic and drive circuitry is located off printhead assemblies 101-103.

Printhead assemblies 101-103 may also each include a memory 155-157 that stores other information that is related to the printhead assembly 101-103. The other information may be associated with the identifier, which may also be stored in memory 155-157 is associated with printhead assembly 101-103. In this way, controller 125 by determining the identifier can have access to a larger amount of data associated with the printhead assembly 101-103

Particularly, electronic controller 125 may include an identifier control circuit configured to blow one or more fuses in programmable memory circuits 141-143 and to determine identifiers from the resistance of the blown fuses. The identifier control circuit may be part of electronic controller 125, and may be any combination of firmware, software, and electronic circuitry. One embodiment of an identifier control circuit will be discussed in conjunction with FIG. 2. Briefly stated, the identifier control circuit may be capable of providing a sufficient amount of electric energy to the fuses to blow them, to measure the resistance of the blown fuses and to digitalize the resistance to create identifiers.

Figure 2:
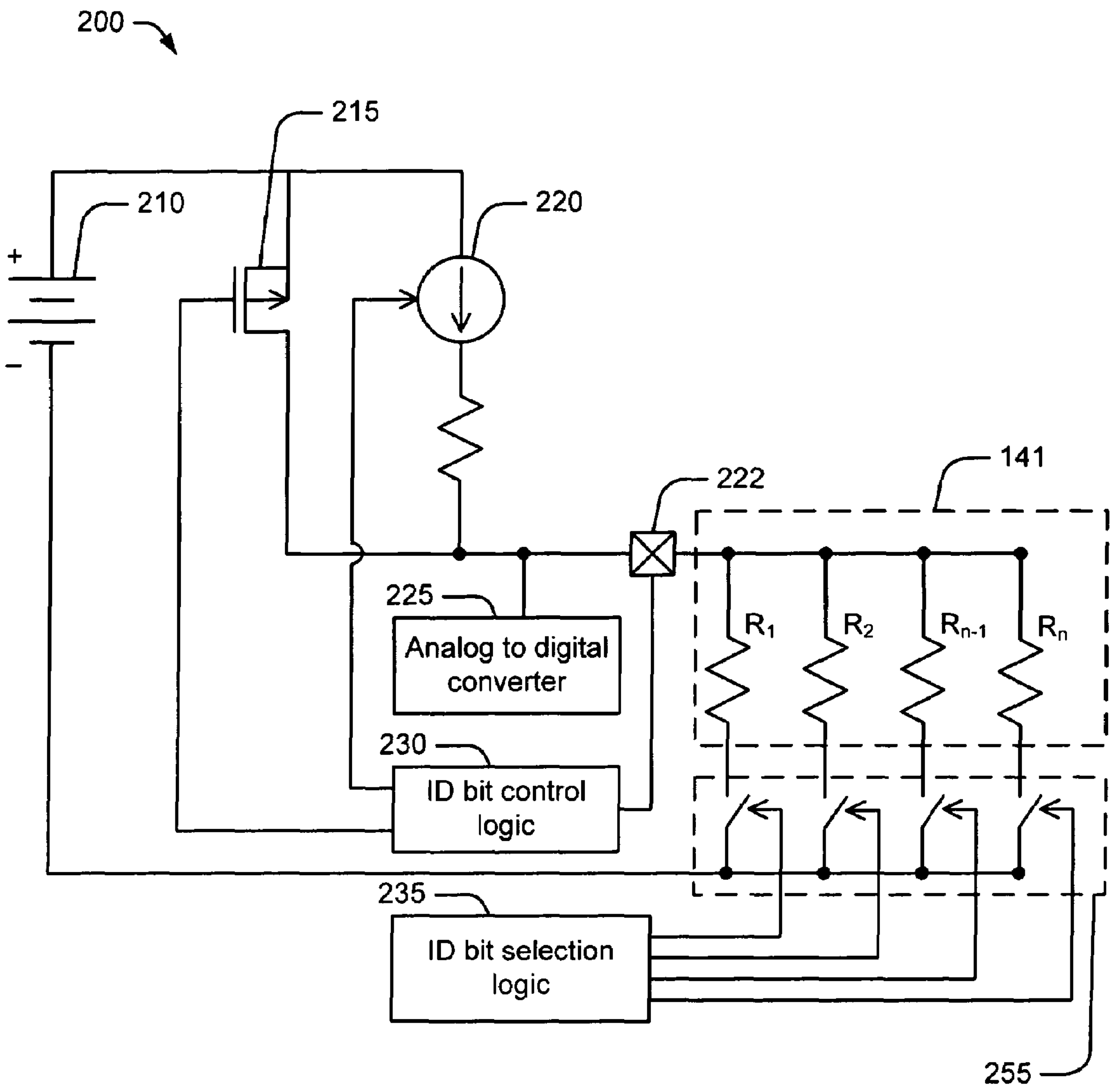
FIG. 2 is a functional schematic diagram of one embodiment of an identifier control circuit.

FIG. 2 is a schematic diagram of an example identifier control circuit 200. Identifier control circuit 200 may be an independent circuit or incorporated into an electronic controller of an inkjet printing system. In operation, identifier control circuit 200 is coupled to a programmable memory circuit, such as programmable memory circuit 141. Programmable memory circuit 141 may include multiple fuses, as represented by resistors $R_1$-$R_n$. In one embodiment, 56 resistors are used to store an identifier and other data.

Identification (ID) bit selection logic 235 is configured to selectively couple fuses $R_1$-$R_n$ to identifier control circuit 200. In particular, ID bit selection logic 235 controls switches 255. ID bit selection logic 235 can open or close each of the switches 255 independently of one another. In the closed position, a switch couples a corresponding fuse to identifier control circuit 200. ID bit selection logic 235 may close a switch for blowing a fuse associated with the switch or for determining the resistance of the fuse.

Identifier control circuit 200 is configured to blow one or more of the fuses in programmable memory circuit 141. ID bit control logic 230 controls the electric current that is applied to blow the fuses. The electrical potential of identifier control circuit 200 is provided by voltage source 210. Since the resistance of the fuses, as represented by resistors $R_1$-$R_n$, can be measured, the voltage may be used to generate a current of a known magnitude. The voltage should be high enough to generate a current to blow a fuse but not so high as to cause the fuses to be completely blown. In one embodiment, a voltage of 7 to 10 volts can be used to produce good results.

ID bit control logic 230 may regulate transistor 215 to produce the desire amount of electric current for blowing fuses. ID bit control logic 230 is typically configured to control switch 222 to produce a voltage pulse sufficient to partially, but not completely, blow a fuse. Many different values of voltage, pulse width, or their combination can be used to generate current to blow fuses (or to partially blow fuses). In one embodiment, a voltage pulse of 0.5 to 2 milliseconds can be used to produce desirable results. As the pulse width increases, the resistance of the fuse in the partially blown state is increased.

ID bit control logic 230 regulates current source 220 to produce the desired amount of electric current for measuring the resistance of partially blown fuses. ID bit selection logic 235 couples a blown fuse for measurement. Analog to digital converter 225 converts the resistance of the blown fuse to data with multiple bits. Analog to digital converter 225 may be configured to measure resistance within a range of values. The range of resistance values may be divided into multiple intervals where each interval is digitally represented as bits of data. For example, if the range of resistance goes from 1K Ohms to 3K Ohms with an interval of 250 Ohms, eight different values may be represented by a single resistor. It is to be appreciated that if the information is represented by fuses with only an intact or blown states, three fuses (e.g., three bits of data) are necessary to represent the same eight different values.

In practice, the measurable range may be much larger and intervals of resistance much smaller than the above example. Thus, each fuse may potentially be used to represent tens or even hundreds of different values. The extent of the measurable range and the size of the intervals typically depends on the component design factors, such as the voltage range of the analog to digital converter, the current source used for measurement, the properties of the fuse, and the like. The fuses may be blown multiple times. For example, a fuse that has been partially blown to obtain a resistance value for storing data may be blown again to obtain a different resistance value for storing other data.

Figure 3:
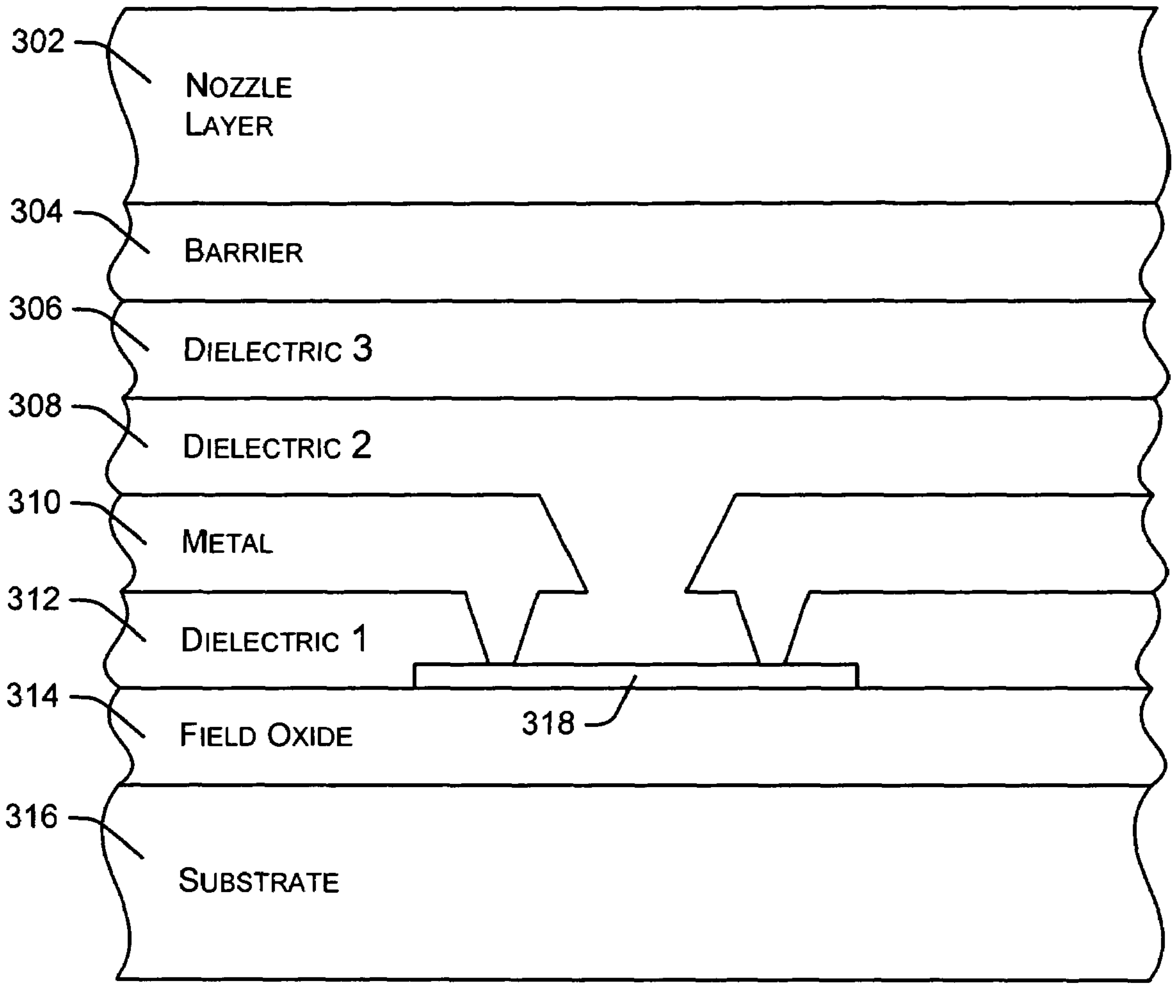
FIG. 3 illustrates a cross-sectional view of one embodiment of a fuse structure.

FIG. 3 illustrates a cross-sectional view of an example fuse structure. The fuse structure may be contained in a programmable memory circuit, e.g. programmable memory circuits 141, in a printhead assembly. This fuse structure has multiple layers, arranged as shown in FIG. 3. The size (e.g., thickness) of each of the multiple layers shown in FIG. 3 are not drawn to scale. Different layers may have similar or different thicknesses relative to one another. For example, the "Field Oxide" layer and the "Dielectric 3" layer are shown in FIG. 3 as having approximately the same thickness. In a particular embodiment, the thickness of the "Field Oxide" layer and the "Dielectric 3" layer may be similar or may be significantly different. Various layers shown in FIG. 3 may also be referred to as "films" or "thin films".

The structure shown in FIG. 3 includes a nozzle layer 302 (also referred to as an orifice plate) composed of a metal or polymer substance. Kapton and nickel plated with a thin layer of platinum are common nozzle layer materials. The nozzle layer 302 is located above a barrier layer 304. The barrier layer 304 is composed of a polymer material such as Vacrel, Parad, or SU-8. The next layer is a dielectric layer 306 composed of $T_6O_5$, SiC, $Si_3N_4$, or $SiO_2$. Below the dielectric layer 306 is another dielectric layer 308 composed of $T_6O_5$. Although FIG. 3 shows dielectric layers 306 and 308 as separate layers, in alternate embodiments, the two layers can be merged into a single layer. Barrier layer 304 prevents fluid, such as ink, from contacting a dielectric layer 306 or other layers below dielectric layer 306. Barrier layer 304 includes various channels that route ink to a firing chamber and one or more nozzles.

The next layer is a metal layer 310, composed of a material such as aluminum. The metal layer 310 may also be referred to as a "metal trace". The metal layer 310 has a gap in the middle of the layer that is filled with material from dielectric layer 308. Adjacent the metal layer 310 is another dielectric layer 312 composed of USG (undoped silicon glass) or BPSG (boron-phosphorous doped glass). This dielectric layer 312 has a gap in the middle of the layer that is filled with material from metal layer 310 and dielectric layer 308. Additionally, the dielectric layer 312 gap is partially filled with a fuse 318 (also referred to as a "fuse layer" or a "resistive layer"). Fuse 318 may also be referred to as a "fusible link". In one embodiment, fuse 318 is composed of polysilicon doped with phosphorous. In alternate embodiments, fuse 318 may be composed of polysilicon doped with arsenic or boron. In other embodiments, fuse 318 may be composed of undoped polysilicon. In another embodiment, fuse 318 is composed of tantalum (Ta), tantalum aluminum (TaAl), or tungsten silicon nitride (WSiN).

The metal layer 310 is electrically coupled to the fuse 318 such that electrical current can flow between the metal layer and the fuse. As shown in FIG. 3, although fuse 318 is electrically coupled to metal layer 310, the fuse is positioned in a different layer than the metal layer.

Adjacent the dielectric layer 312 is a field oxide layer 314 that provides electrical and thermal isolation between a substrate 316 and dielectric layer 312/fuse 318. Field oxide layer 314 may also be referred to as an "electrical isolation layer" or a "thermal isolation layer". The last layer illustrated in FIG. 3, the substrate 316, is composed of silicon.

When the fuse 318 is a closed circuit (i.e., allowing electrical current to flow through the fuse), the fuse appears as shown in FIG. 3. Electrical current is conducted by the metal layer 310, until the current reaches the gap in the metal layer. When the fuse allows electrical current to flow through the fuse, the electrical current flows "across" the gap in the metal layer 310 by using the fuse 318. Thus, electrical current flows across the metal layer 310 when the fuse is a closed circuit (e.g., not burned or blown). However, if the fuse is blown, the fuse 318 is damaged in the vicinity of the gap in the metal layer 310 such that the fuse does not allow electrical current to flow "across" the gap in the metal layer.

The fuse 318 shown in FIG. 3 can be fully or partially blown by applying an electrical current of sufficient magnitude and duration to damage the structure of fuse but not to completely blow the fuse so that the fuse still conducts electrical current but at a much higher resistance.

In one embodiment, the process of partially or completely blowing fuse 318 includes applying an electrical voltage of 7 volts across the fuse in the form of a pulse until the fuse blows to the desired resistance. Completion of the fuse blowing process can be determined, for example, by identifying a drop in the current flowing from the electrical source generating the 7 volts that are applied across the fuse. This drop in current flow indicates a substantial increase in the resistance of the fuse. In one embodiment, a fuse will partially blow in approximately 1 microsecond with the application of 7 volts across the fuse. The voltage and the time required to blow a particular fuse may vary depending on various factors, such as the size, shape, position and composition of the particular fuse.

The structure shown in FIG. 3 positions the fuse 318 such that dielectric layers 306 and 308 are located above the fuse. This configuration allows thermal diffusion of the heat generated by the fuse blowing process, which reduces thermal interference by the barrier layer 302. Since blowing a fuse generates heat, that heat is absorbed by the surrounding material(s). The fuse structure shown in FIG. 3 is close to the substrate, which is a good conductor of thermal energy. Thus, the substrate helps dissipate a certain amount of thermal energy that might otherwise be absorbed by materials located above the fuse ("above" the fuse based on the orientation shown in FIG. 3), e.g., the dielectric layers 306 and 308, and the barrier layer 304. If too much thermal energy is absorbed by materials above the fuse, the temperatures of those materials may rise to a point that the heat damages (e.g., decomposes) those materials, thereby increasing the possibility of device malfunction. Thus, the fuse structure shown in FIG. 3 reduces the likelihood of damage to materials surrounding the fuse without requiring a hole in the barrier layer.

The structure shown in FIG. 3 represents an example structure. Alternate embodiments may include different layer arrangements, different fuse sizes, different fuse positions, and the like. Further, the shape, size and/or position of the gap in the metal layer 310 may change in alternate embodiments.

Figure 4:
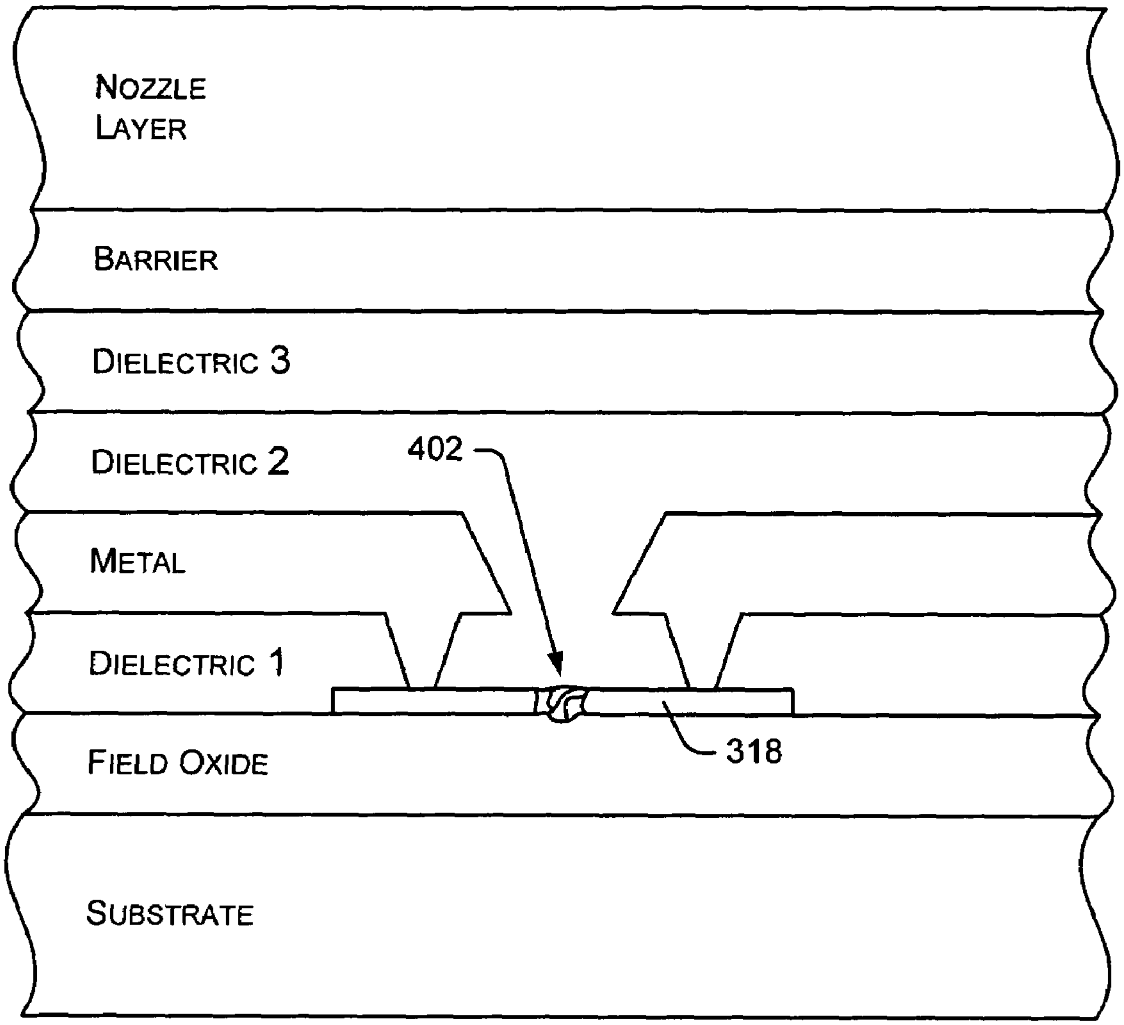
FIG. 4 illustrates a cross-sectional view of one embodiment of a fuse structure after the fuse has been partially blown.

FIG. 4 illustrates a cross-sectional view of the fuse structure shown in FIG. 3 after fuse 318 has been partially blown. After being blown, fuse 318 has been physically damaged such that the fuse's ability to conduct electrical current is diminished. In particular, a damaged region 402 located in fuse 318 is created due to the thermal energy applied to fuse 318 during the fuse blowing process. Some electrical current can still flow across the damage region 402 but must overcome much higher resistance.

Figure 5:
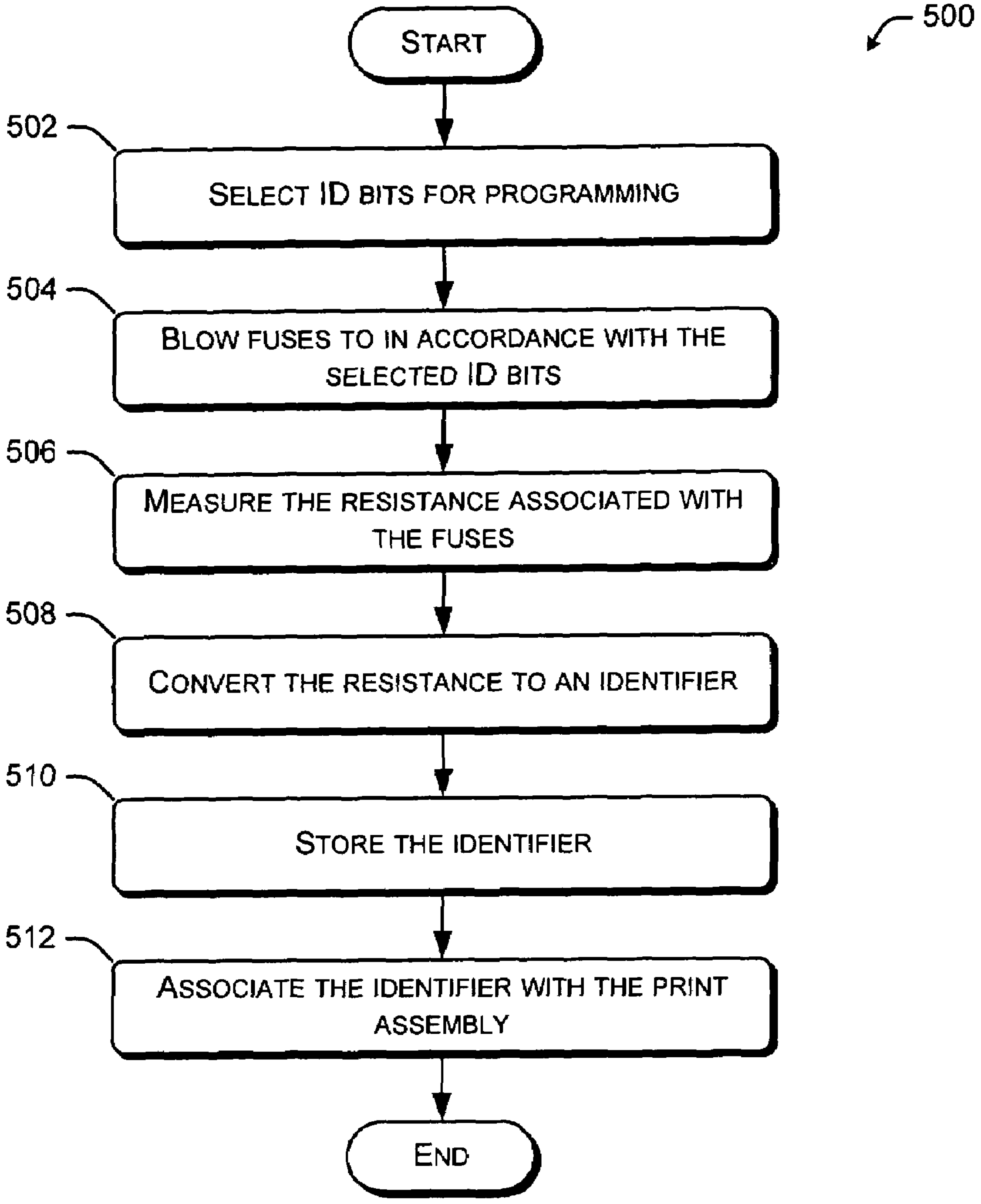
FIG. 5 is a flow diagram illustrating one embodiment of a process for programming an identifier into a programmable memory circuit.

FIG. 5 is a flow diagram illustrating an example process 500 for programming an identifier into a programmable memory circuit. Process 500 may be used by a controller of an inkjet printer or other device to program an identifier into a programmable memory circuit. Before process 500 is performed, a determination may be made whether the programmable memory circuit has already been programmed. Process 500 begins at block 502 where ID bits are selected for programming. The ID bits may contain information about a printhead assembly, such as pen type (e.g. black, color, photo, etc.), ink level, calibration, and the like. At block 504, fuses in the programmable memory circuit are blown in accordance with the selected ID bits. In particular, a sufficient amount of electric current is applied to the fuses, which partially blows the fuses by damaging the structure of the fuses.

At block 506, the values of resistance associated with the fuses are measured. At block 508, the resistance values are converted to an identifier. In particular, a range of resistance values is divided into intervals where each interval associates with bits of data. The resistance value of each fuse is converted to the associated bits of data. The bits of data associated with all of the fuses are combined to form the identifier. It is to be appreciated that the identifier is different from the selected ID bits. In particular, the identifier is created when the fuses are blown for programming the ID bits and cannot typically be pre-selected. The uniqueness of the identifier provides an effective means for component identification.

At block 510, the identifier is stored in the memory of the inkjet printer. At block 512, the identifier stored in memory is associated with the printhead assembly. Other information related to the printhead assembly may also be associated with the identifier. Process 500 then ends.

Figure 6:
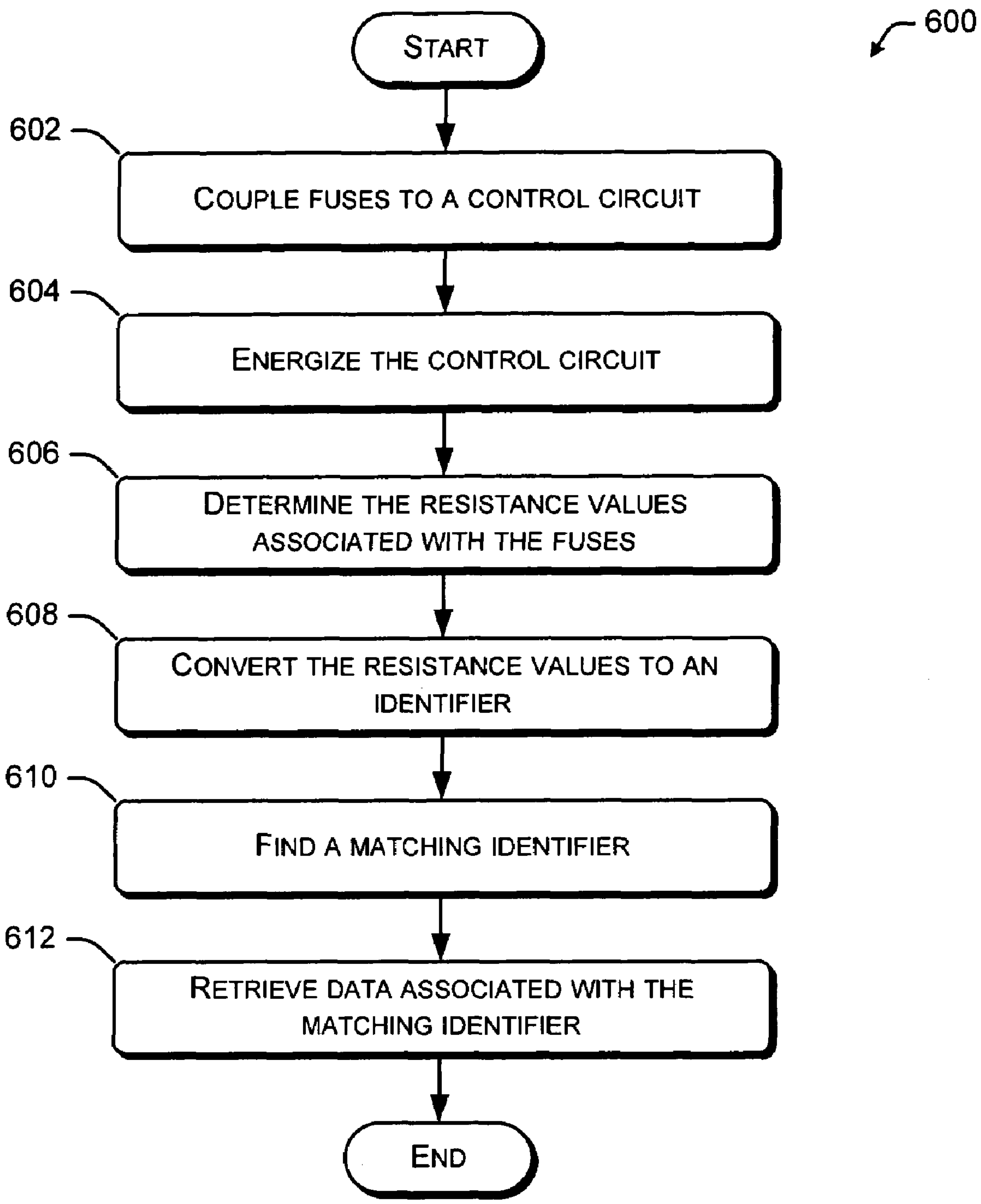
FIG. 6 is a flow diagram illustrating one embodiment of a process for retrieving an identifier from a programmable memory circuit.

FIG. 6 is a flow diagram illustrating an example process 600 for retrieving an identifier from a programmable memory circuit. Process 600 may be used by a controller of an inkjet printer to retrieve an identifier from a programmable memory circuit in a printhead assembly. Moving from a start block, process 600 moves to block 602 where fuses in the programmable memory circuit are coupled to another circuit for analysis. For example, the printhead assembly may include leads for coupling the printhead assembly to the controller. The leads allow the coupling of a control circuit in the controller to the fuses in the programmable memory circuit.

At block 604, the control circuit is energized so that electric current may pass through the fuses. At block 606, the resistance values associated with the fuses are determined. At block 608, the resistance values are converted to an identifier.

At block 610, the identifier is matched against identifiers that have been previously determined. The previously determined identifiers are typically associated with printhead assemblies that have been previously installed in the inkjet printers. At block 612, the data associated with the matching identifier is retrieved. The data may include many types of information about a printhead assembly, such as ink usage, printhead life, calibration data, and the like. Process 600 then ends.

Although the description above uses language that is specific to structural features and/or methodological acts, it is to be understood that the invention defined in the appended claims is not limited to the specific features or acts described. Rather, the specific features and acts are disclosed as exemplary forms of implementing the invention.

The invention claimed is:

1. A method for programming an identifier on a device the method comprising:

providing the device with a programmable memory circuit having multiple fuses;

applying energy to a selected fuse, the energy being sufficient to only partially blow the fuse such that an open circuit condition is not created but an ability of the fuse to conduct electrical current is reduced; and after applying the energy, measuring a resistance of the selected fuse.

2. The method of claim 1, wherein providing the device with a programmable memory circuit comprises providing a programmable read only memory (PROM) on the device.

3. The method of claim 1, wherein applying energy comprises applying an amount of electrical current to the selected fuse that is less than an amount required to completely blow the fuse but sufficient to damage the fuse.

4. The method of claim 1, further comprising applying further energy to the selected fuse if it is determined that the resistance of the fuse is not high enough.

5. The method of claim 1, further comprising associating the measured resistance with a bit of data used in the identifier.

6. The method of claim 1, further comprising leaving other selected fuses of the programmable memory circuit undamaged.

7. The method of claim 1, further comprising completely blowing other selected fuses of the programmable memory circuit.

8. The method of claim 7, wherein completely blowing other selected fuses comprises applying an amount of electrical current to the other selected fuses that creates open circuit conditions for the other selected fuses.

9. The method of claim 1, wherein the device comprises a printhead assembly or an ink reservoir.

10. The method of claim 1, wherein applying energy comprises providing varied levels of energy to multiple selected fuses so as to damage the fuses to different degrees such that the fuses will exhibit different resistances between a closed circuit condition and an open circuit condition.

11. A method for determining identity information for a device, the method comprising:

providing energy to fuses of a programmable memory circuit with which the device is provided, the energy being insufficient to damage the fuses, wherein at least one of the fuses has been partially blown such that an open circuit condition is not present but an ability of the at least one fuse to conduct electrical current is reduced;

determining resistance values for each of the fuses to which energy was provided;

converting the resistance values to bits of data; and determining the identifier from the bits of data.

12. The method of claim 11, wherein providing energy to fuses further comprises providing energy to undamaged fuses and fully blown fuses such that resistance values are determined for each of an undamaged fuse, a partially blown fuse, and a fully blown fuse of the programmable memory circuit.

13. The method of claim 11, wherein determining resistance values comprises determining resistance values of multiple partially blown fuses, each being damaged to a different degree and therefore exhibiting a different level of resistance.

14. The method of claim 11, further comprising matching the determined identifier against previously determined identifiers to identify information concerning the device.

15. The method of claim 14, wherein the information concerning the device comprises one of component identification, ink usage data, printhead life data, or calibration data.

16. The method of claim 11, wherein the device comprises one of a printhead assembly, an ink reservoir, or an inkjet printer.

* * * * *

UNITED STATES PATENT AND TRADEMARK OFFICE

CERTIFICATE OF CORRECTION

PATENT NO. : 7,375,997 B2 
APPLICATION NO. : 11/492517
DATED : May 20, 2008
INVENTOR(S) : Hugh Rice et al.

It is certified that error appears in the above-identified patent and that said Letters Patent is hereby corrected as shown below:

In column 8, line 2, in Claim 1, after “device” insert -- , --.

In column 8, line 15, in Claim 2, delete “read only” and insert -- read-only --, therefor.

Signed and Sealed this

Twenty-ninth Day of July, 2008

JON W. DUDAS
*Director of the United States Patent and Trademark Office*